United States Patent
Matsuyama et al.

(10) Patent No.: US 8,586,484 B2
(45) Date of Patent: Nov. 19, 2013

(54) FILM FORMING METHOD AND FILM FORMING APPARATUS

(75) Inventors: Hideaki Matsuyama, Yokosuka (JP); Takehito Wada, Funabashi (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 68 days.

(21) Appl. No.: 13/254,458

(22) PCT Filed: Dec. 16, 2009

(86) PCT No.: PCT/JP2009/006910
§ 371 (c)(1),
(2), (4) Date: Nov. 8, 2011

(87) PCT Pub. No.: WO2010/100702
PCT Pub. Date: Sep. 10, 2010

(65) Prior Publication Data
US 2012/0115257 A1    May 10, 2012

(30) Foreign Application Priority Data

Mar. 4, 2009  (JP) ................................. 2009-050453

(51) Int. Cl.
*H01L 21/31* (2006.01)
(52) U.S. Cl.
USPC .......................................................... 438/758
(58) Field of Classification Search
USPC .......................................... 438/758, 771, 776
See application file for complete search history.

(56) References Cited

U.S. PATENT DOCUMENTS

| | | | |
|---|---|---|---|
| 6,375,860 B1 * | 4/2002 | Ohkawa et al. | 216/71 |
| 6,509,542 B1 * | 1/2003 | Benjamin et al. | 219/121.43 |
| 6,885,153 B2 * | 4/2005 | Quon | 315/111.31 |
| 2003/0143822 A1 | 7/2003 | Kondo et al. | |
| 2006/0110933 A1 | 5/2006 | Shimosawa | |

FOREIGN PATENT DOCUMENTS

| | | |
|---|---|---|
| JP | 62-142767 A | 6/1987 |
| JP | 2-166283 A | 6/1990 |
| JP | 5-291150 A | 11/1993 |
| JP | 6-280030 A | 10/1994 |
| JP | 7-069790 A | 3/1995 |
| JP | 2002-371357 A | 12/2002 |
| JP | 2006-144091 A | 6/2006 |
| JP | 2007-214176 A | 8/2007 |

* cited by examiner

*Primary Examiner* — Brook Kebede
(74) *Attorney, Agent, or Firm* — Rabin & Berdo, P.C.

(57) ABSTRACT

A film forming process is performed on a substrate in a deposition chamber. A first electrode is provided in the deposition chamber and is grounded. A second electrode is provided in the deposition chamber to face the first electrode. A radio frequency power supply supplies radio frequency power to the second electrode. A DC power supply supplies a DC bias voltage to the second electrode. A control unit adjusts a bias voltage to be less than the potential of the second electrode when the radio frequency power is supplied, but the bias voltage is not supplied. In this way, it is possible to improve film quality while preventing a reduction in the deposition rate of a film during deposition.

47 Claims, 15 Drawing Sheets

FILM FORMING METHOD AND FILM FORMING APPARATUS

TECHNICAL FIELD

The present invention relates to a film forming method and a film forming apparatus for forming, for example, a semiconductor film.

BACKGROUND ART

As a method of forming a thin film, plasma chemical vapor deposition (CVD) has been widely used. Examples of the plasma CVD have many kinds of methods, for example capacitively-coupled CVD, inductively-coupled CVD, microwave CVD, and ECR-CVD. Among them, the capacitively-coupled CVD has been most widely used. The capacitively-coupled CVD excites plasma between a pair of parallel plate electrodes. Therefore, the capacitively-coupled CVD with a simple structure can deposit a uniform film as compared to the other methods.

The capacitively-coupled CVD can form various kinds of thin films including semiconductor films, such as silicon-based thin films, SiC, GaAs, and GaN films, dielectric films, such as $SiN_x$ and $SiO_2$ films, high hardness films, such as a diamond film, a diamond-like carbon thin film (DLC), and a BN film, and polymer films.

For example, the silicon-based thin film is used for a thin film solar cell. The thin film solar cell has a thin silicon film with thickness of several micrometers (μm) or less and has the advantage that an amount of silicon, which is a raw material, used in it is smaller than that in a bulk crystal silicon solar cell.

The characteristics of a thin film formed by the plasma CVD method depend on the plasma state during deposition. For example, parameters for controlling the plasma state are power to be supplied, pressure, and the kind and the flow rate of raw material gas. Since the potential of the substrate is lower than that of plasma, some of the ions generated in plasma are accelerated due to the difference between the potential of plasma and the potential of the substrate and then collide with the substrate (ion bombardment). For example, Japanese Patent Application Laid-Open (JP-A) No. 2-166283 discloses a method that applies a negative DC voltage to the substrate to actively increase the energy of ion bombardment, thereby controlling the stress of a SiN thin film.

JP-A No. 62-142767 discloses a technique in which, when an amorphous silicon film is formed on a substrate, radio frequency power for generating plasma is supplied to an electrode having the substrate provided thereon and a positive DC voltage is applied to the electrode.

JP-A No. 5-291150 (particularly, paragraphs 9 to 16) discloses a technique that supplies radio frequency power for generating plasma to a cathode electrode and applies a DC or AC bias voltage to the electrode. In the technique, the substrate is not provided on the cathode electrode, but is provided on an anode electrode. In addition, JP-A No. 5-291150 discloses a technique that controls the bias voltage on the basis of the floating potential of a plasma space. The floating potential indicates the cathode potential when the bias voltage is not applied and means a self-bias voltage generated by plasma. The technique disclosed in JP-A No. 5-291150 is to use ion bombardment for improving the film quality of a thin film. The bias voltage is applied to increase the cathode potential to be equal to or more than the floating potential. Then, the plasma potential increases and the strength of ion bombardment on the substrate provided on the anode electrode increases. Therefore, practically, the technique disclosed in JP-A No. 5-291150 is for application of a bias voltage equal to or more than the floating potential to the cathode electrode.

DISCLOSURE OF THE INVENTION

Problems to be Solved by the Invention

In the plasma CVD, it is important to improve film quality while preventing a reduction in the deposition rate. However, in the techniques disclosed in Japanese Patent Application Laid-Open (JP-A) No. 2-16628, JP-A No. 62-142767 and JP-A No. 5-291150, it is difficult to manage both to maintain the deposition rate and to improve the film quality according to the kind of films to be formed and the purpose thereof.

The invention has been made in view of the above-mentioned problems and an object of the invention is to provide a film forming method and a film forming apparatus capable of improving film quality while preventing a reduction in the deposition rate.

Means for Solving the Problems

In a first film forming method according to the invention, a first electrode and a second electrode are providing in a deposition chamber and the second electrode faces the first electrode. The first electrode is grounded and has a substrate provided thereupon. A material gas is also provided in the deposition chamber. A radio frequency power and a bias voltage are supplied to the second electrode, to thereby form a film on the substrate from the material gas by plasma CVD. A first average potential of the second electrode with the radio frequency power supplied thereto without the bias voltage is determined. While the radio frequency power and bias voltage are supplied to the second electrode, a second average potential of the second electrode is adjusted to be less than the first average potential of the second electrode.

In a second film forming method according to the invention, a first electrode and a second electrode are providing in a deposition chamber and the second electrode faces the first electrode. A material gas is also provided in the deposition chamber. A substrate is providing on the first electrode. Radio frequency power is supplied to the second electrode so as to generate plasma. A bias voltage is supplied to the first electrode or the second electrode. The bias voltage is controlled on the basis of a first plasma potential that is determined based upon $(V_{dc}+V_{0p})/2$, to perform plasma CVD. $V_{dc}$ is an average potential of the second electrode with respect to the first electrode and $V_{0p}$ is a voltage amplitude of the second electrode with respect to the first electrode.

A film forming apparatus according to the invention includes a deposition chamber, a first electrode, a second electrode, a radio frequency supply unit, a power lead line and a measuring line. In the deposition chamber a film forming process is performed on a substrate. The first electrode is provided in the deposition chamber. The second electrode is provided in the deposition chamber to face the first electrode. The radio frequency supply unit supplies radio frequency power to the second electrode. The measuring line is connected to the second electrode and transmits a signal used to determine potential of the second electrode, and is provided separately from the power lead wire.

Effects of the Invention

According to the invention, it is possible to improve film quality while preventing a reduction in the deposition rate of a film during deposition.

BEST MODE FOR CARRYING OUT THE INVENTION

Figure 1:
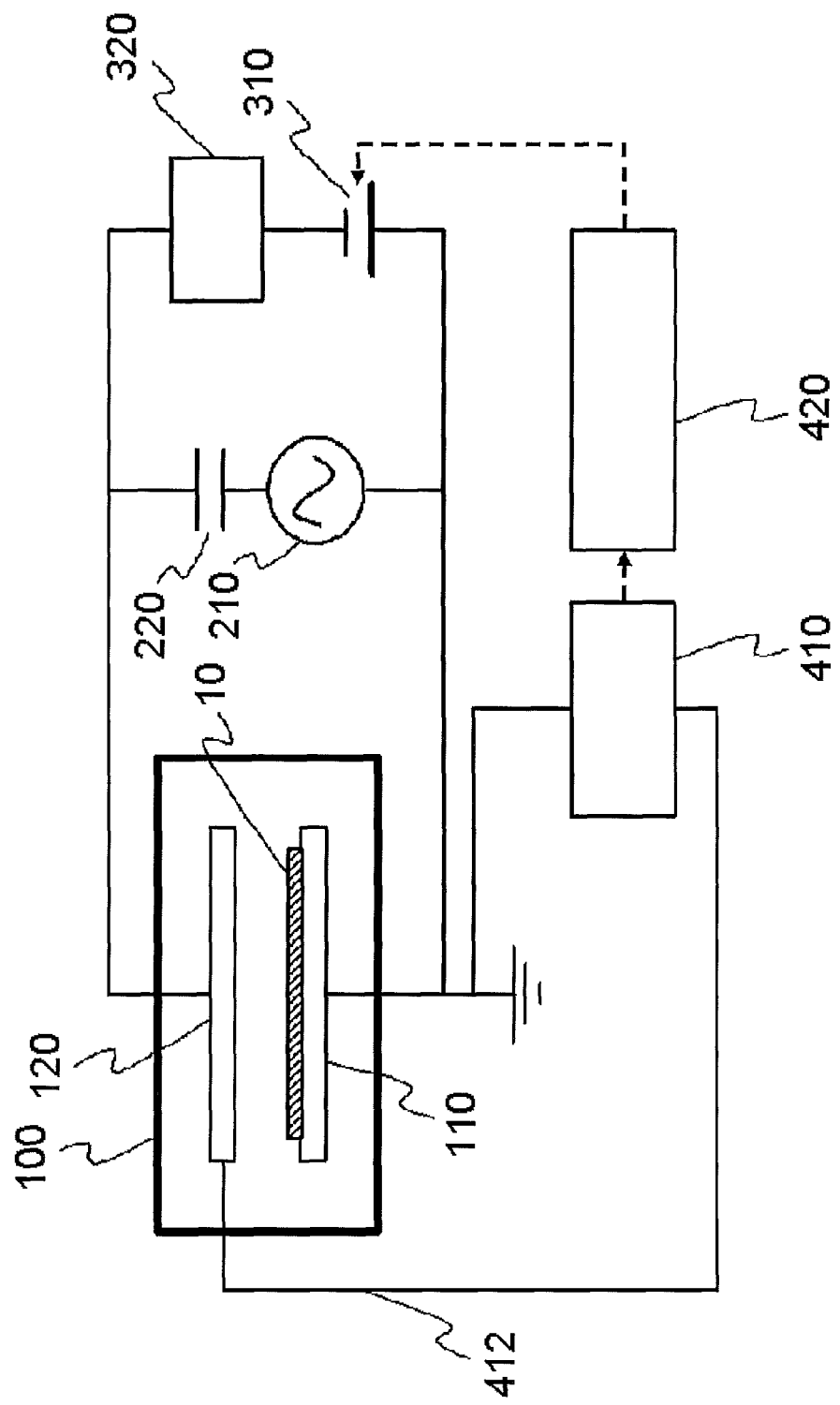
FIG. 1 is a cross-sectional view illustrating the structure of a film forming apparatus according to a first embodiment.

Hereinafter, exemplary embodiments of the invention will be described with reference to the accompanying drawings. In all drawings, the same components are denoted by the same reference numerals and a description thereof will be appropriately omitted.

FIG. 1 is a cross-sectional view illustrating the structure of a film forming apparatus according to a first embodiment. The film forming apparatus includes a deposition chamber 100, a first electrode 110, a second electrode 120, a radio frequency power supply 210 (radio frequency supply unit), a DC power supply 310 (bias voltage supply unit), an electrode potential measuring unit 410, and a control unit 420. In the deposition chamber 100, a film forming process is performed on a substrate 10. The first electrode 110 is provided in the deposition chamber 100 and is connected to the ground. The second electrode 120 is provided in the deposition chamber 100 so as to face the first electrode 110. The radio frequency power supply 210 supplies radio frequency power to the second electrode 120. The DC power supply 310 inputs a DC bias voltage to the second electrode 120. The electrode potential measuring unit 410 measures the voltage of the second electrode 120. The control unit 420 controls a bias voltage such that the average potential of the second electrode 120 when the radio frequency power and the bias voltage are supplied is less than the average potential of the second electrode 120 when the radio frequency power is supplied, but the bias voltage is not supplied. An AC power supply may be provided instead of the DC power supply 310. In this case, the bias voltage is an AC voltage whose average value is not zero.

When the film forming apparatus shown in FIG. 1 is used, it is possible to perform a film forming process on the substrate 10 by supplying the radio frequency power and the bias voltage to the second electrode 120 to perform plasma CVD. In the film forming process, it is possible to control the bias voltage such that the potential of the second electrode 120 is less than the potential of the second electrode 120 when the radio frequency power is supplied, but the bias voltage is not supplied. According to this structure, since the difference between plasma potential, which is the potential of plasma, and the potential of the substrate 10 is reduced, it is possible to reduce ion bombardment on the formed film. In this way, it is possible to improve film quality while preventing a reduction in the deposition rate, which will be described in detail below.

For example, the frequency of the radio frequency power is equal to or higher than 13 MHz. The first electrode 110 is provided with a heater for heating the substrate 10. The deposition chamber 100 is provided with an exhaust means (not shown). It is possible to control the internal pressure of the deposition chamber 100 by controlling the exhaust means and the supplied amount of raw material gas.

The radio frequency power supply 210 is connected to the second electrode 120 through a matching box 220. The DC power supply 310 is connected to the second electrode 120 through a radio frequency cut filter 320 that is provided on a bias voltage supply line for supplying the bias voltage to the second electrode 120. The radio frequency cut filter 320 removes radio frequency power including frequency components of the radio frequency power supplied from the radio frequency power supply 210. In this way, the radio frequency power supplied from the radio frequency power supply 210 is prevented from being supplied to the DC power supply 310.

For example, the film forming apparatus shown in FIG. 1 forms a semiconductor film or a photoelectric conversion layer of a thin film solar cell. The photoelectric conversion layer is, for example, a crystalline semiconductor or an amorphous semiconductor. The crystalline semiconductor is, for example, microcrystalline silicon, and the amorphous semiconductor is, for example, amorphous silicon. The semiconductor film includes, for example, silicon, germanium, and carbon. When the semiconductor film is formed, a raw material gas fed into the film forming apparatus includes at least one selected from the group consisting of a silicon-containing gas, a carbon-containing gas, and a germanium-containing gas. The raw material gas may include a diluent gas (for example, hydrogen or rare gas) or it may include impurity gas, for example, diborane or phosphine.

The substrate 10 may be made of glass or metal. It is preferable that a film forming surface of the substrate 10 be electrically connected to the first electrode 110. For the electrical connection, the substrate 10 may have, for example, a structure in which a conductive film is formed on the surface of an insulating base, or the entire substrate 10 may be made of a conductive material.

The film forming apparatus shown in FIG. 1 further includes a measuring line 412. The measuring line 412 is connected to the second electrode 120 and is independent from a radio frequency power lead line. The electrode potential measuring unit 410 is connected to the measuring line 412 and measures the voltage of the second electrode 120 with respect to the ground potential. The voltage to be measured includes the average potential $V_{dc}$ and the voltage amplitude $V_{0p}$ of the second electrode 120. The value measured by the electrode potential measuring unit 410 is output to the control unit 420.

The control unit 420 controls the output of the DC power supply 310 on the basis of the value measured by the electrode potential measuring unit 410. Specifically, the control unit 420 controls the DC power supply 310 such that the average potential of the second electrode 120 is lower than the average potential of the second electrode 120 when the radio frequency power is supplied but the bias voltage (in this embodiment, a DC voltage) is not supplied.

The control unit 420 controls the bias voltage such that plasma potential, which is the potential of plasma with respect to the first electrode 110, is more than zero. In this case, it is preferable that the control unit 420 control the bias voltage such that the plasma potential is less than that when the radio frequency power is supplied but the bias voltage is not supplied.

If the bias voltage is controlled such that the plasma potential is close to zero, a DC current flowing between the first electrode 110 and the second electrode 120 increases sharply when the plasma potential is lower than a specific value. It is preferable that the plasma potential during the film forming process is greater than this specific value, that is, the value of the bias voltage during the film forming process is greater than that when the plasma potential is greater than this specific value. The reason will be described below.

It is very difficult to measure the plasma potential during deposition. In this embodiment, the control unit 420 also functions as a plasma potential calculating unit. Specifically, the control unit 420 calculates a plasma potential $(V_{dc}+V_{0p})/2$ from the average potential $V_{dc}$ of the second electrode 120 with respect to the first electrode 110 (that is, the ground potential) and the voltage amplitude $V_{0p}$ of the second electrode 120. That is, in this embodiment, the electrode potential measuring unit 410 and the control unit 420 function as a plasma potential measuring unit. It is preferable that the control unit 420 controls the bias voltage such that the plasma potential is less than 100 V.

Next, the validity of the plasma potential calculated by the above-mentioned method will be described. When an oscilloscope is used to measure the potential $V_c(t)$ of the second electrode 120, the potential $V_c(t)$ is represented by the following Expression 1 using the average potential $V_{dc}$, the voltage amplitude $V_{0p}$, the frequency f of radio frequency power, and time t:

$$V_c(t)=V_{0p}\times\sin(2\pi f\times t)+V_{dc}.$$ [Expression 1]

A variation $V_p(t)$ in the potential of plasma over time is represented by the following Expression 2:

$$V_p(t)=(V_{0p}+V_{dc})/2\times\{1+\sin(2\pi f\times t)\}.$$ [Expression 2]

Expression 2 is described in, for example, "Plasma Semiconductor Process Technology," Uchida-Rokakuho Pub., 2003, pp. 38-39.

An ion has a mass significantly greater than that of an electron and cannot follow a radio frequency component while the plasma potential is changed. Therefore, the plasma potential $V_p$ affecting the behavior of ions is a value obtained by removing a radio frequency component from Expression 2, that is, $(V_{0p}+V_{dc})/2$.

Figure 2:
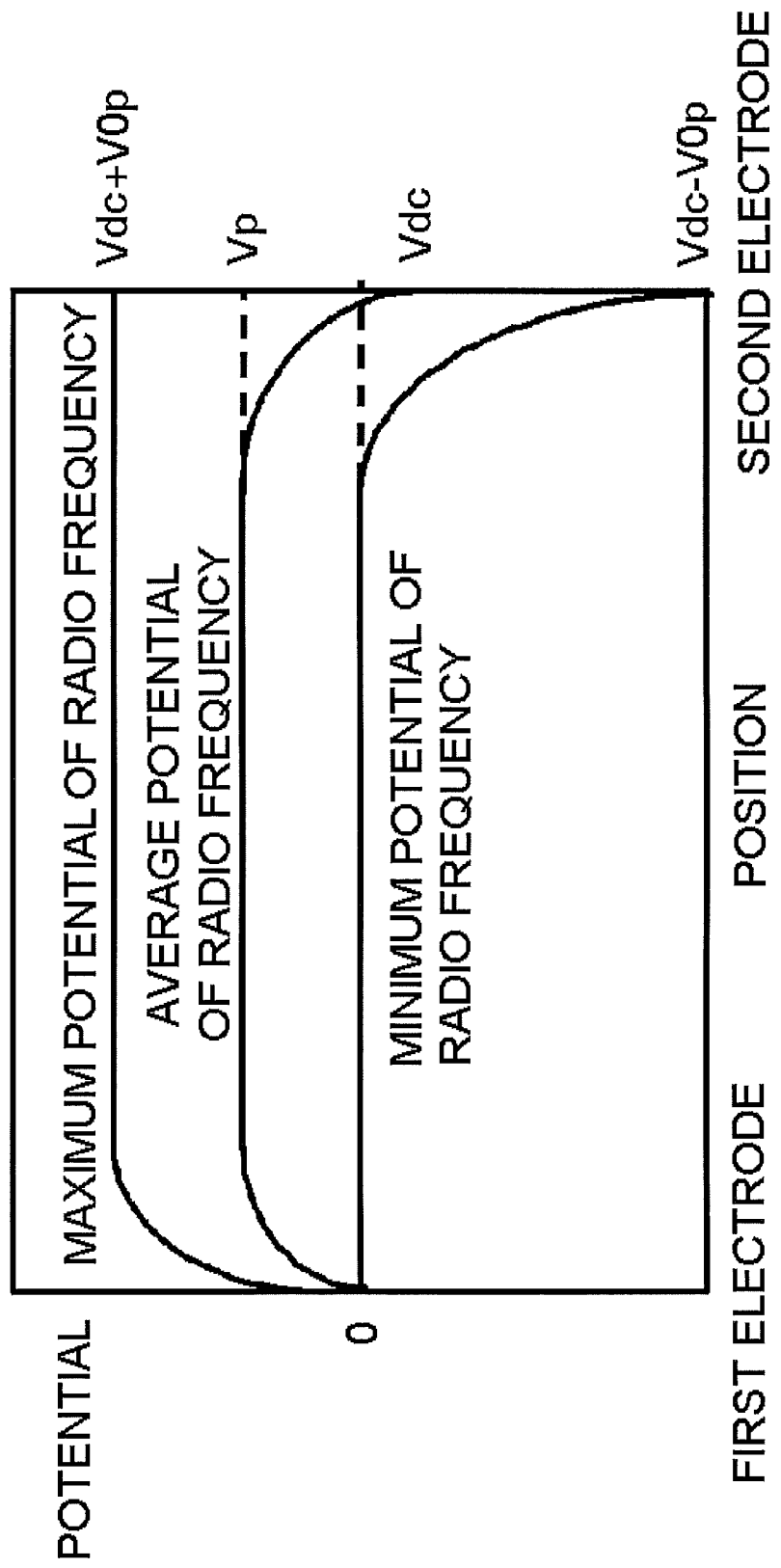
FIG. 2 is a diagram illustrating the aspect of a voltage between a first electrode and a second electrode when plasma is generated between the first electrode and the second electrode.

Next, the relationship between the voltages will be described with reference to FIG. 2. FIG. 2 is a graph schematically illustrating a variation of the potential (that is, the potential in the plasma) of radio frequency power between the first electrode 110 and the second electrode 120. In FIG. 2, the average potential of the radio frequency power input to the second electrode 120 is $V_{dc}$, the plasma potential is $V_p$, and the amplitude of the radio frequency is $V_{0p}$.

Since the first electrode 110 is connected to the ground, the maximum potential, average potential, and minimum potential of the radio frequency are all zero on the first electrode 110. As the distance from the first electrode 110 increases, the maximum potential and the average potential of the radio frequency increase to the positive potential side and are then maintained at a constant level. In this case, the average potential of the radio frequency at this constant level corresponds to the plasma potential $V_p$. The relationship as stated above is established when $V_{0p}>V_{dc}$, and for example, the relationship $V_p>V_{dc}$ or $V_{0p}>V_p$ is obtained. From the latter relationship, the amplitude (corresponding to the plasma potential $V_p$) of the radio frequency at the position between the first electrode 110 and the second electrode 120 is less than the amplitude $V_{0p}$ of the radio frequency input to the second electrode 120.

With the approach to the second electrode 120, the maximum potential of the radio frequency is hardly changed, but the voltage amplitude of the radio frequency increases. Therefore, the average potential and the minimum potential of the radio frequency fall. On the second electrode 120, the average potential of the radio frequency is $V_{dc}$ and the voltage amplitude of the radio frequency is $V_{0p}$.

When the potential of the bias voltage input to the second electrode 120 is less than that of the second electrode 120 when the radio frequency power is supplied but the bias voltage is not supplied, the average potential $V_{dc}$ of the radio frequency in the second electrode 120 fall. With the reduction in the average potential $V_{dc}$, the graph shown in FIG. 2 is shifted in a direction in which the overall potential is reduced except for the ground potential (the potential on the first electrode 110 and the minimum potential in plasma). Therefore, it is possible to adjust the plasma potential to be less than that when the radio frequency power is supplied but the bias voltage is not supplied.

Figure 3:
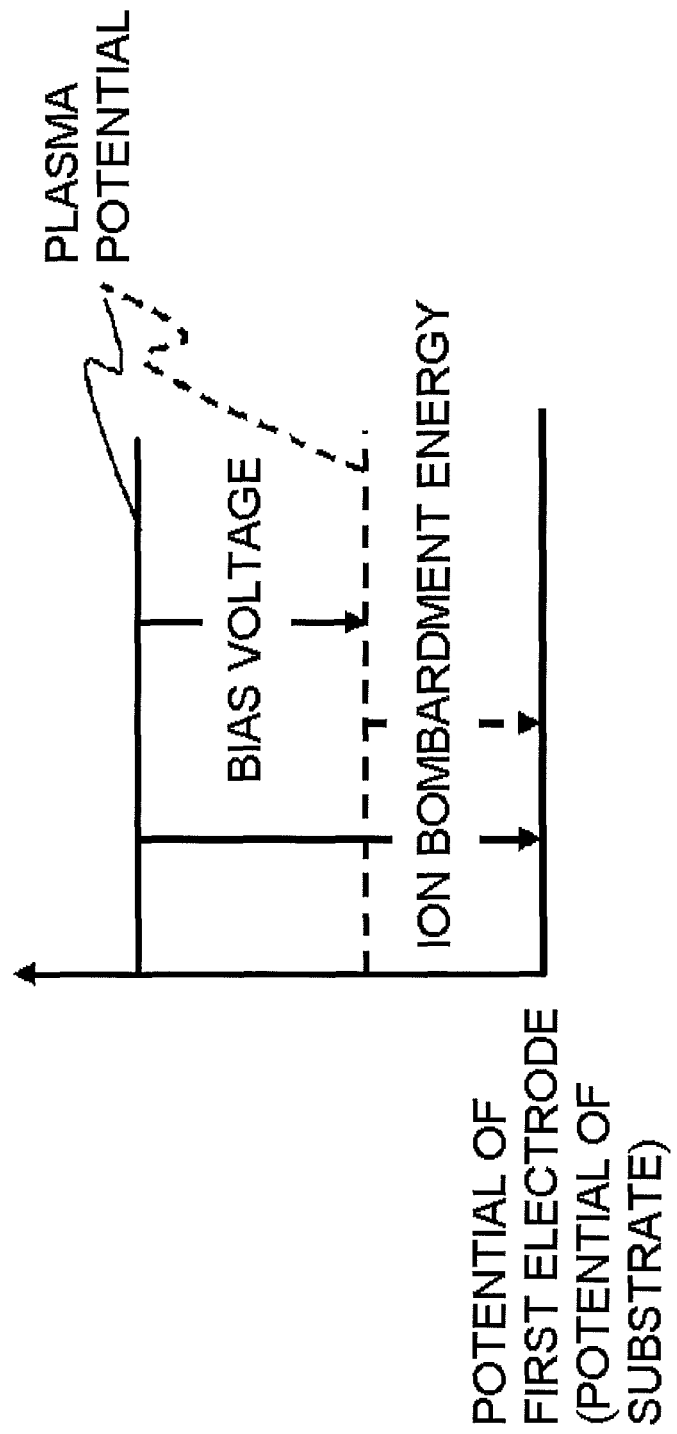
FIG. 3 is a diagram illustrating the reason why ion bombardment on a substrate is reduced when plasma potential is reduced.

FIG. 3 is a diagram illustrating the reason why ion bombardment on the substrate 10 is reduced when the plasma potential is reduced. The amount of ion bombardment is determined by the difference between the plasma potential and the potential of the first electrode 110 (that is, the substrate 10). When the plasma potential is reduced, the difference between the plasma potential and the potential of the first electrode 110 is reduced, and ion bombardment on the substrate 10 is reduced.

Figure 4:
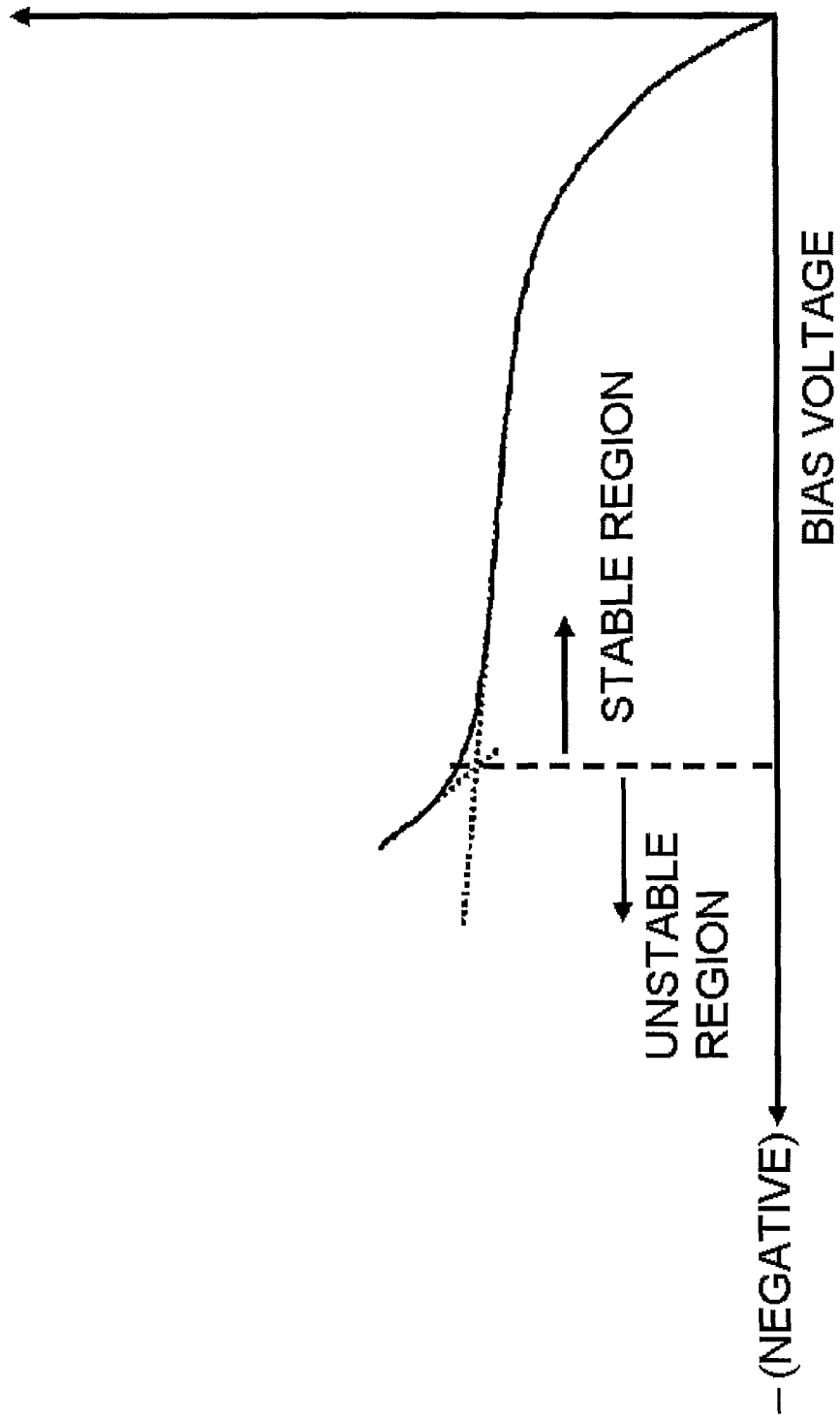
FIG. 4 is a diagram illustrating the reason why a bias voltage is controlled such that a bias current is less than a specific value when a film forming process is performed.

FIG. 4 is a diagram illustrating the reason why the bias voltage is controlled such that a bias current is less than a specific value when the film forming process is performed. As described above, when the bias voltage is reduced such that the plasma potential is close to zero, the amount of DC current flowing between the first electrode 110 and the second electrode 120 increases sharply before the plasma potential is zero. When the plasma potential is less than that at this point (that is, when the bias voltage is reduced), plasma becomes unstable, which causes problems in the film forming process. Therefore, when the film forming process is performed, it is preferable that the bias voltage, that is, the plasma potential be more than that at the point where the bias current increases rapidly.

Next, the operation and effect of this embodiment will be described. In this embodiment, radio frequency power for generating plasma is supplied to the second electrode 120. In addition, DC bias power is supplied to the second electrode 120 such that the potential of the second electrode 120 is less than that when the radio frequency power is supplied but the bias power is not supplied. In this way, the plasma potential is less than that when the bias voltage is not supplied and the bombardment of ions incident from the plasma to the substrate 10 is reduced. This effect is noticeable when the plasma potential $V_p$ is less than 100 V. In order that this effect occurs, the substrate 10 needs to be electrically connected to the first electrode 110 such that it is not charged. The degradation of the ion bombardment is effective in, for example, the formation of a photoelectric conversion layer of a thin-film solar cell, and improves the film quality of the formed photoelectric conversion layer. Since a film is generally formed by the deposition of neutral radicals, the influence of the incident ions on the growth rate of a film formed on the substrate 10 is small.

Here the plasma potential is not directly measured, but is calculated by the average potential $V_{dc}$ and the voltage amplitude $V_{0p}$ of the second electrode 120. Therefore, it is possible to measure the plasma potential at the same time as a film is formed in practice, without any influence on plasma, as compared to, for example, the measurement that the Langmuir probe is inserted into plasma and the calculated result can be fed back to the deposition conditions.

Since the second electrode 120 and the electrode potential measuring unit 410 are connected to each other through the measuring line 412, which is a wire only for measurement, it is possible to accurately measure the potential of the second electrode 120. Therefore, it is possible to perform the above-mentioned control operation.

In this embodiment, the operator, not the control unit 420, may adjust the bias voltage.

Figure 5:
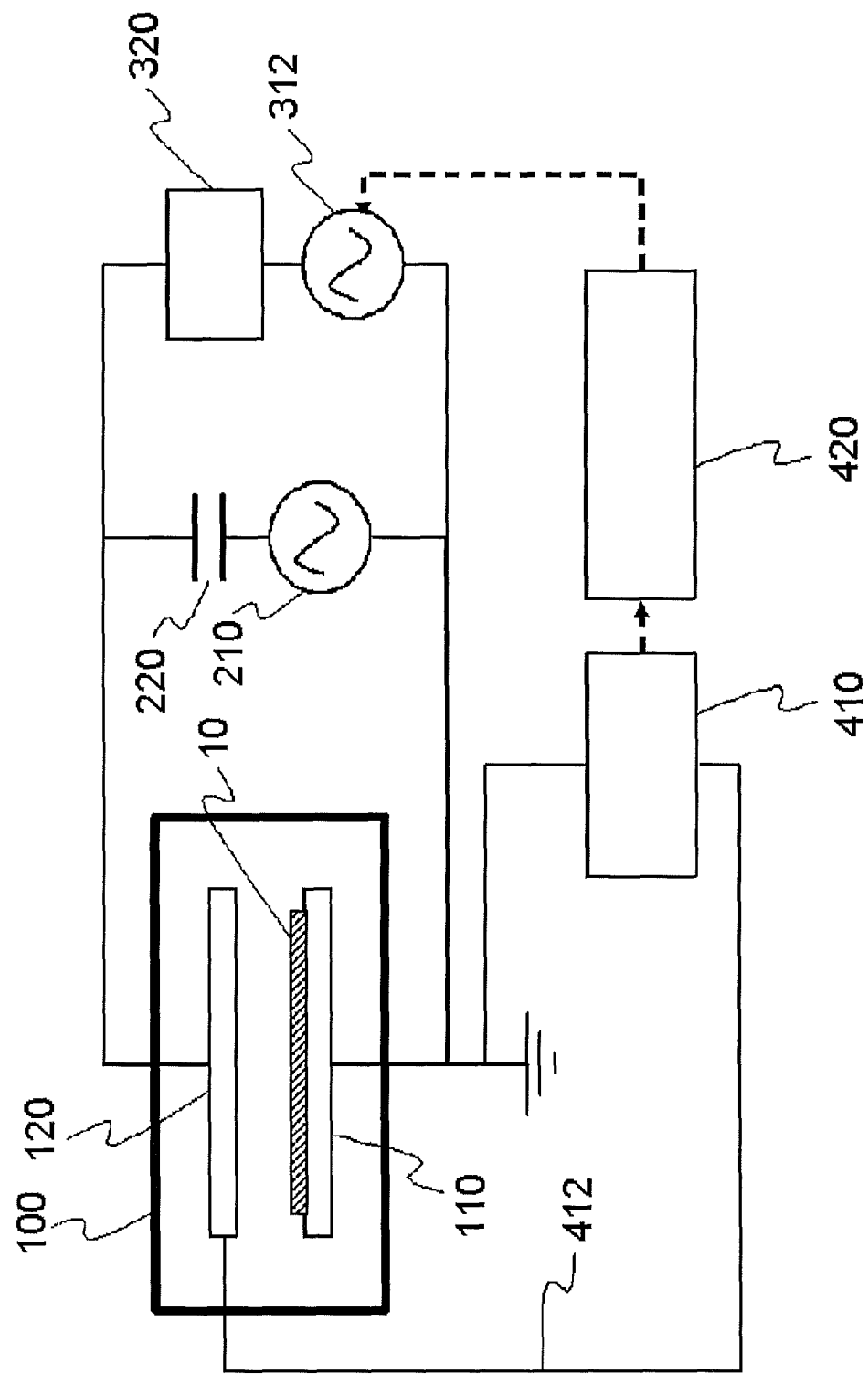
FIG. 5 is a diagram illustrating the structure of a film forming apparatus according to a second embodiment.

FIG. 5 is a diagram illustrating the structure of a film forming apparatus according to a second embodiment. The film forming apparatus according to this embodiment has the same structure as that according to the first embodiment except that an AC power supply 312 supplies a bias voltage. The frequency of an AC voltage output from the AC power supply 312 is less than that of the radio frequency power output from the radio frequency power supply 210, and is, for example, equal to or less than 1 MHz that ions can follow. The control unit 420 treats the average voltage of the AC power supply 312 the same as the DC voltage when the DC power supply 310 is used, thereby controlling the AC power supply 312. That is, the average voltage of AC power output from the AC power supply 312 is not zero, but is, for example, a voltage obtained by superimposing the AC voltage on the DC voltage or by half-wave rectifying the AC voltage.

In this embodiment, when the amplitude of the AC voltage is not large, it is possible to obtain the same effect as that in the first embodiment.

Figure 6:
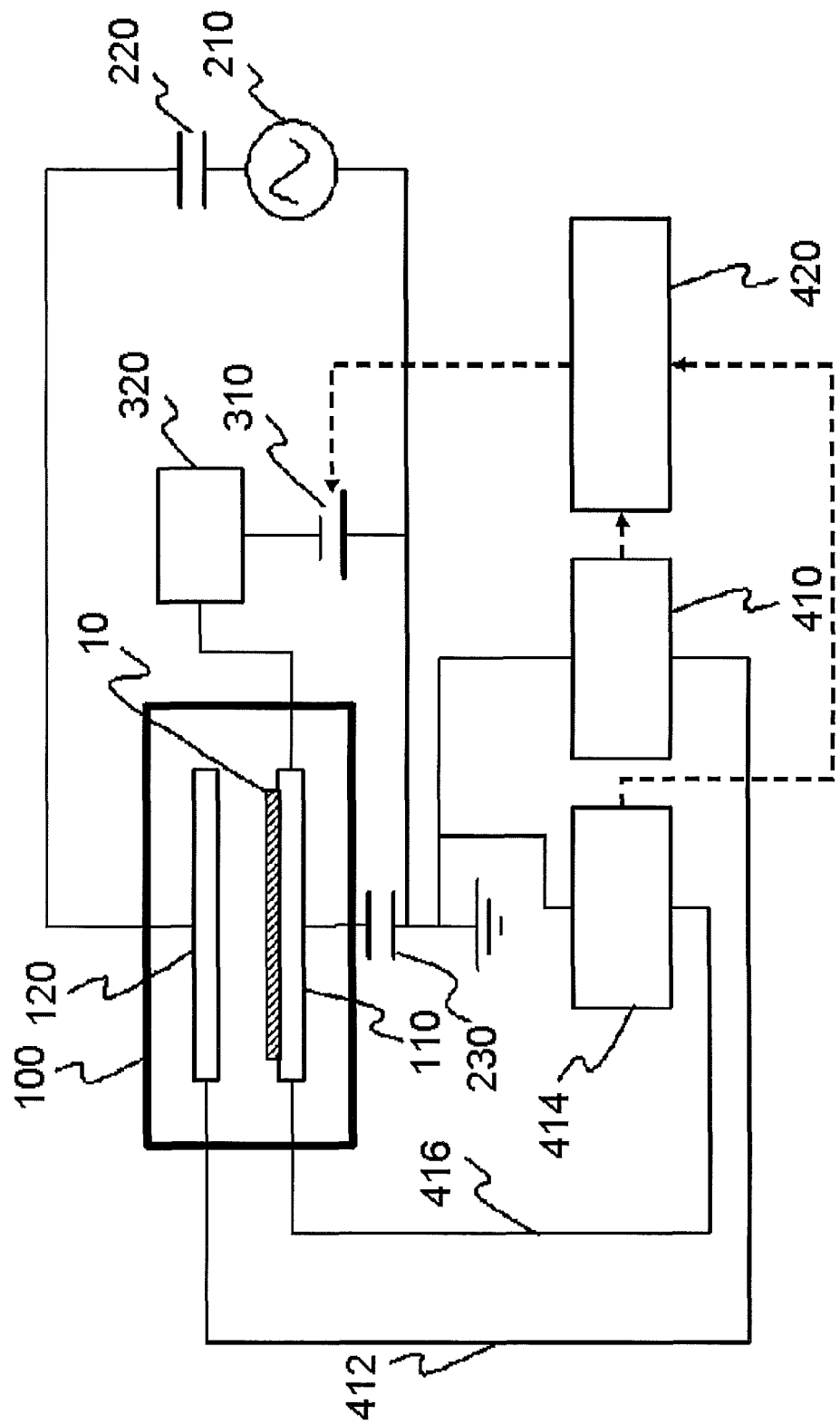
FIG. 6 is a diagram illustrating the structure of a film forming apparatus according to a third embodiment.

FIG. 6 is a diagram illustrating the structure of a film forming apparatus according to a third embodiment. The film forming apparatus according to this embodiment has the same structure as the film forming apparatus according to the first embodiment except for the following points. First, the first electrode 110 is not directly connected to the ground, but is connected to the ground through a radio pass filter 230 that passes only radio frequency power. In addition, the DC power supply 310 supplying the bias voltage is connected to the first electrode 110 through the radio frequency cut filter 320. An electrode potential measuring unit 414 for measuring the potential of the first electrode 110 is connected to the first electrode 110 through a measuring line 416. The measuring line 416 is provided separately from a line for connecting the DC power supply 310 and the first electrode 110. The value measured by the electrode potential measuring unit 414 is output to the control unit 420.

In this embodiment, the electrode potential measuring unit 410 measures the potential of the second electrode 120 and outputs the measurement result to the control unit 420. The electrode potential measuring unit 414 measures the potential of the first electrode 110 and outputs the measurement result to the control unit 420. The control unit 420 controls the bias voltage output from the DC power supply 310 such that the potential of the first electrode 110 is close to the plasma potential. As the plasma potential is positive when no bias voltage is applied, the bias voltage applied is positive. The control unit 420 calculates the plasma potential using the same method as that in the first embodiment.

Figure 7:
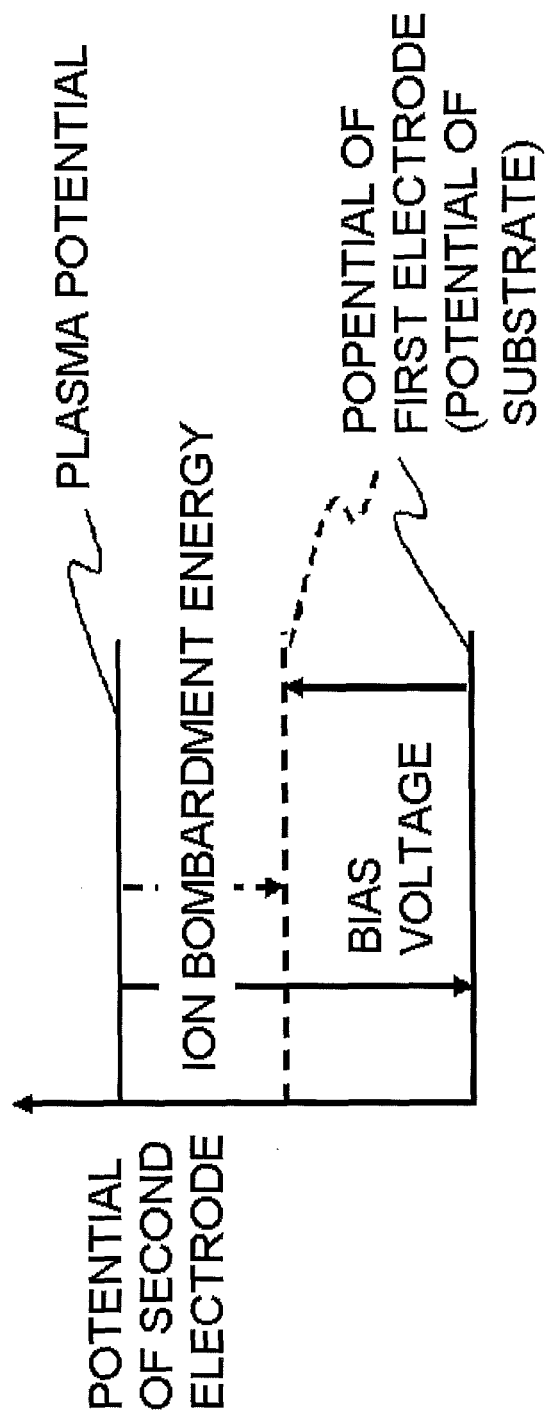
FIG. 7 is a diagram illustrating a reduction in ion bombardment when the potential of the substrate increases.

FIG. 7 is a diagram illustrating a reduction in ion bombardment on the substrate 10 in this embodiment. When the DC power supply 310 outputs a positive voltage to the first electrode 110, the potential of the first electrode 110, that is, the potential of the substrate 10 is shifted in the positive direction and is close to the plasma potential. As a result, the difference between the plasma potential and the potential of the substrate 10 is reduced and the ion bombardment on the substrate 10 is reduced.

Therefore, in this embodiment, it is possible to obtain the same effect as that in the first embodiment.

Figure 8:
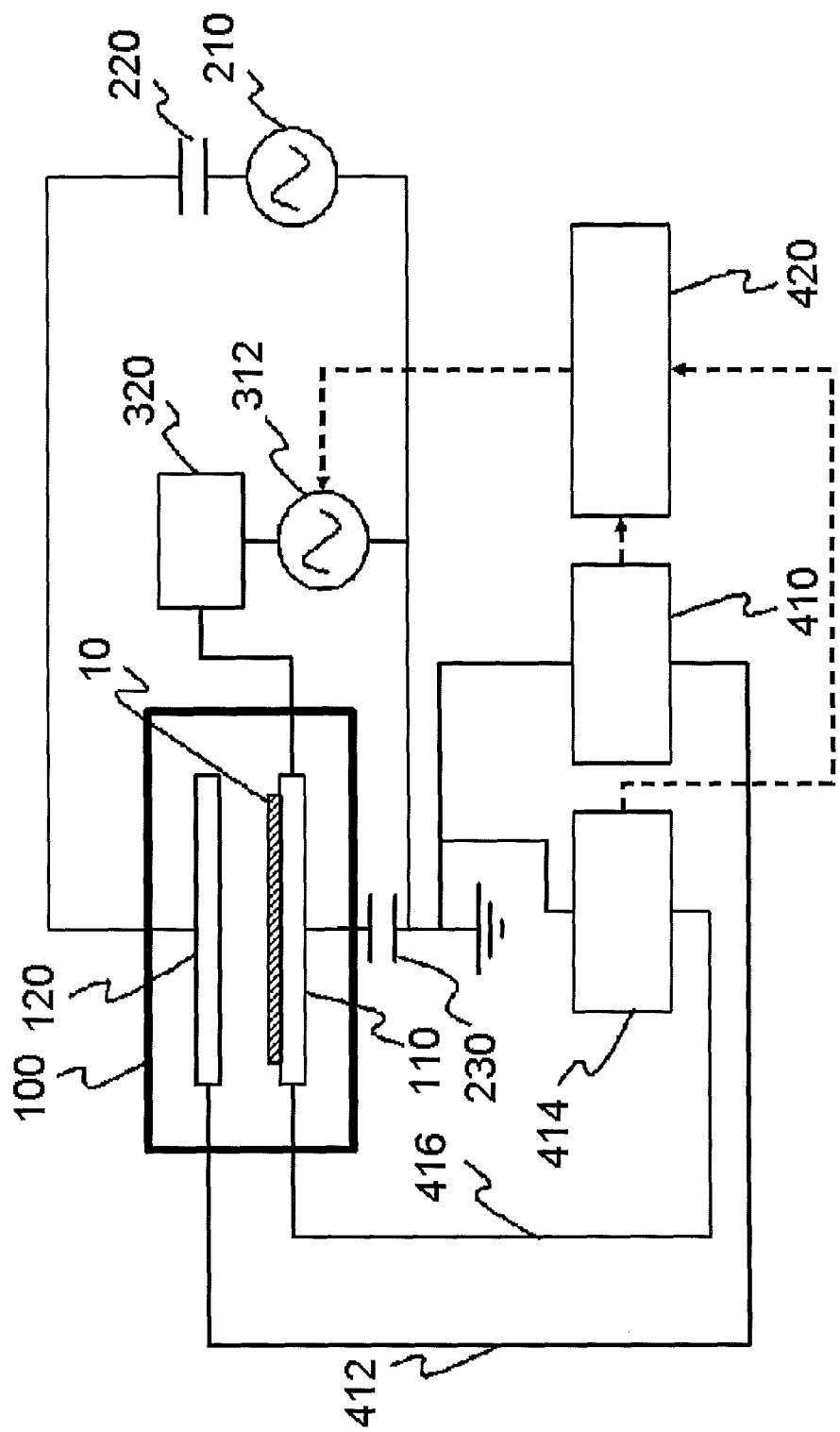
FIG. 8 is a diagram illustrating the structure of a film forming apparatus according to a fourth embodiment.

FIG. 8 is a diagram illustrating the structure of a film forming apparatus according to a fourth embodiment. The film forming apparatus has the same structure as that according to the third embodiment except that it includes the AC power supply 312 according to the second embodiment, instead of the DC power supply 310. In this embodiment, it is possible to obtain the same effect as that in the first embodiment.

Figure 9:
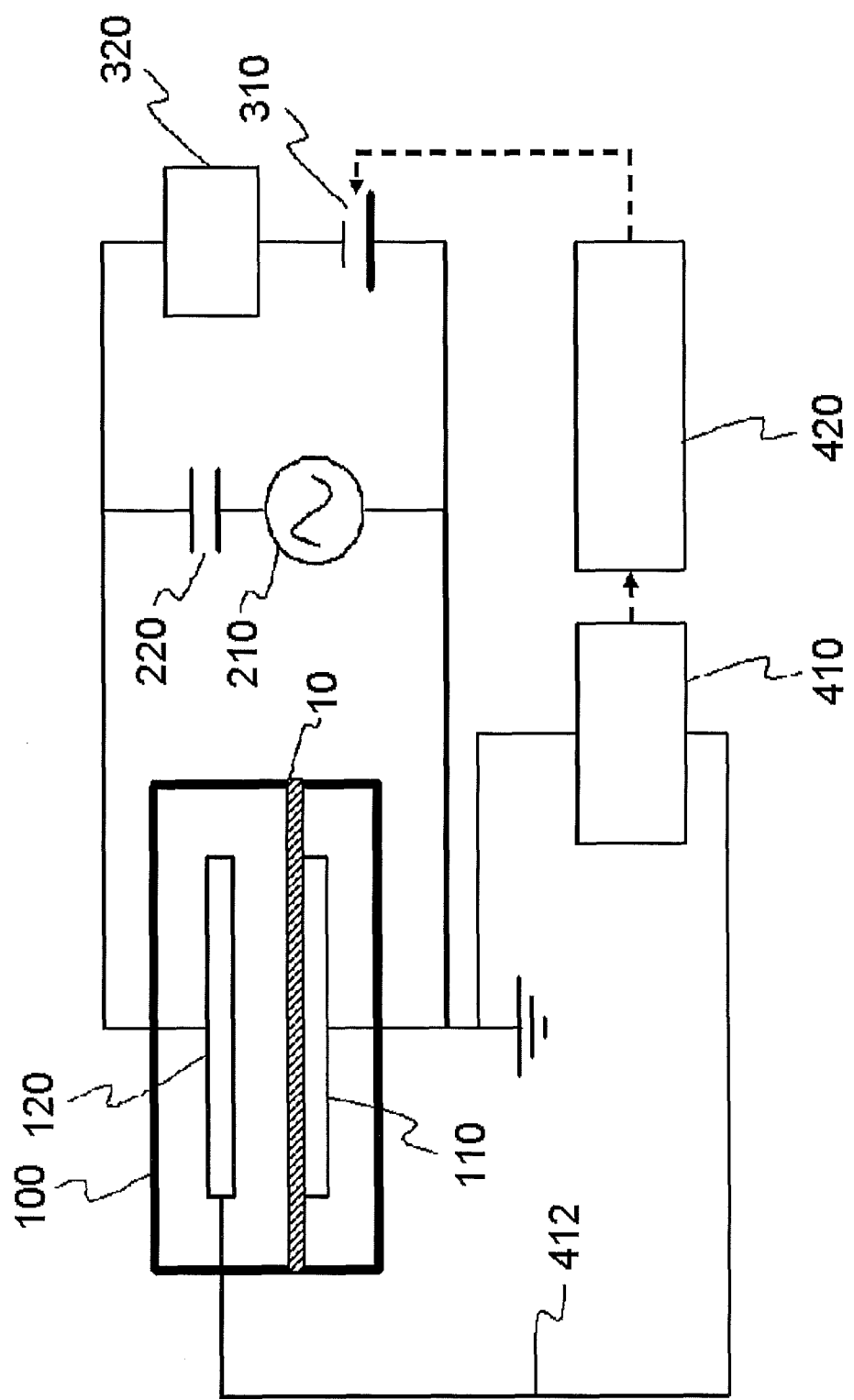
FIG. 9 is a diagram illustrating the structure of a film forming apparatus according to a fifth embodiment.

FIG. 9 is a diagram illustrating the structure of a film forming apparatus according to a fifth embodiment. The film forming apparatus has the same structure as that according to any one of the first to fourth embodiments except that it continuously performs a film forming process on the substrate 10. FIG. 9 shows a structure similar to that according to the first embodiment.

In the continuous film forming process according to this embodiment, a flexible substrate 10 is used. The flexible substrate 10 is selected from, for example, resin films made of polyimide, polyamide, polyimide-amide, polyethylene naphthalate, polyethylene terephthalate, polyether imide, polyether ether ketone, and polyether sulfone. The substrate 10 may be formed by providing a conductive layer on the above-mentioned resin film. The substrate 10 may be a flexible metal film, such as a flexible stainless film, a flexible iron film, a flexible titanium film, or a flexible aluminum film.

When the substrate 10 is a metal film or a resin film coating a conductive layer, a portion of the substrate in which the film forming process is not performed comes into contact with a film transport roller (not shown), or a carry-in port or a carry-out port of the deposition chamber 100. Therefore, the first electrode 110 and the deposition chamber 100 are electrically connected to each other through the substrate 10. In particular, there is no problem in the film forming apparatuses according to the first and second embodiments. However, it is difficult to apply this embodiment to the film forming apparatuses according to the third and fourth embodiments in which the bias voltage is applied to the first electrode 110. However, this embodiment can be applied when the conductive film formed on the resin film is cut to have an insulating property or when the transport roller, and the carry-in port and the carry-out port of the deposition chamber 100 are electrically insulated with an insulating material. In this embodiment, it is possible to obtain the same effect as that in the first embodiment.

The embodiments of the invention have been described above with reference to the drawings. The invention is just illustrative, and various structures other than the above may be used. In each of the above-described embodiments, the film forming apparatus has been described, but the same bias voltage as that in each of the above-described embodiments may be applied to, for example, a dry etching apparatus. In this case, it is possible to perform etching with little damage due to ion bombardment.

EXAMPLES

Example 1

A comparative experiment between a case in which the potential of the second electrode 120 was measured at the output terminal of the matching box 220 (at the terminal of the matching box 220 close to the second electrode 120) and a case in which the potential was measured using the measuring line 412 was conducted.

A film forming apparatus had the same structure as that according to the first embodiment. As a raw material gas, 12 sccm of $SiH_4$ and 1700 sccm of hydrogen were used. The pressure of the deposition chamber 100 was 12 torr and the temperature of the substrate 10 was 200° C. The frequency and power of the radio frequency power supply 210 were 40 MHz and 50 W to 200 W, respectively. An oscilloscope was used as the electrode potential measuring unit 410.

The potential measured by the oscilloscope was a sine wave represented by Expression 1 and its frequency was 40 MHz, which was the value of the power supply.

Figure 10:
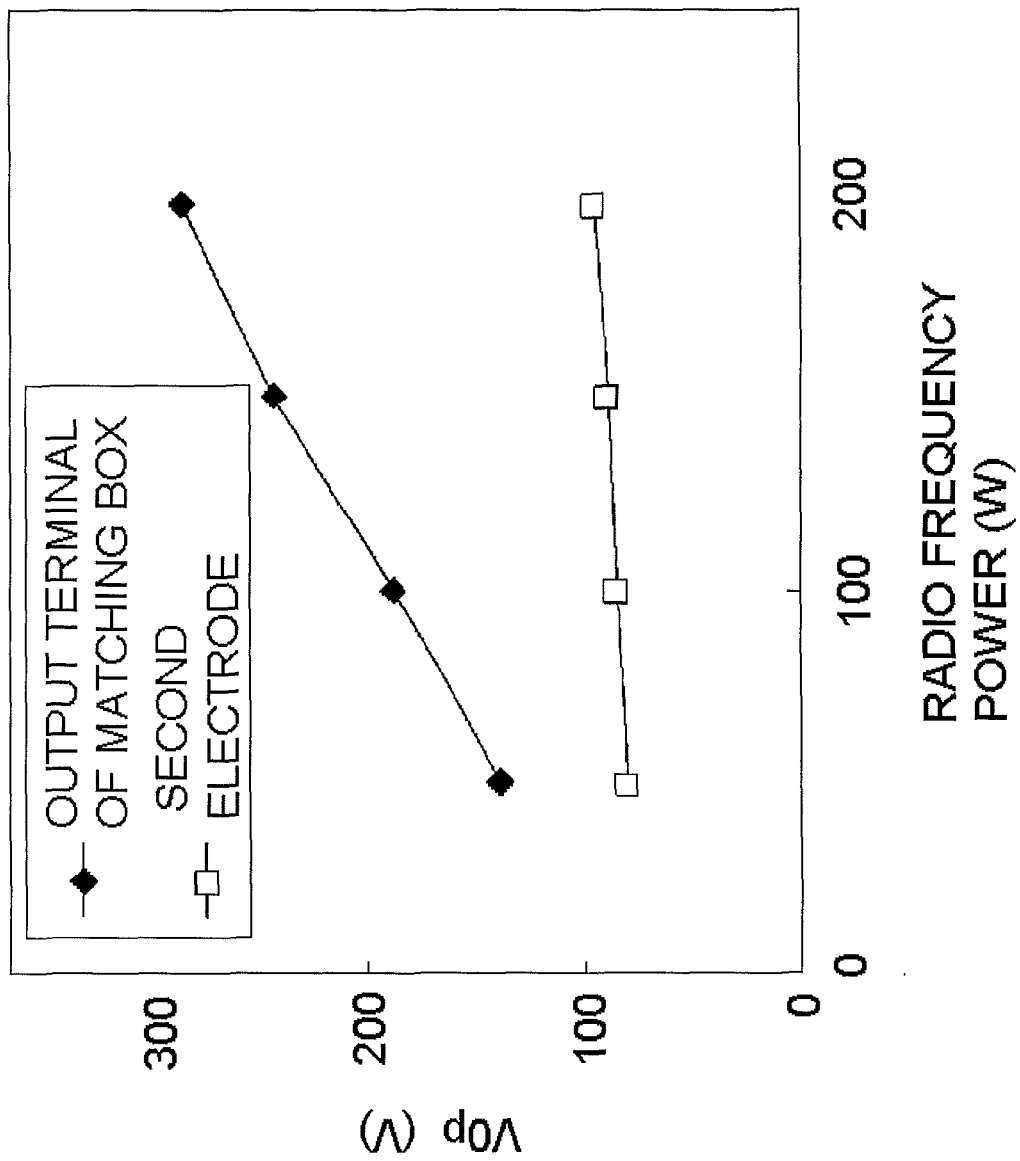
FIG. 10 is a diagram illustrating an example in which the measurement result of the voltage amplitude $V_{0p}$ of radio frequency power measured by an oscilloscope is affected by a measurement position.

FIG. 10 shows the relationship between the voltage amplitude $V_{0p}$ of the radio frequency power measured by the oscilloscope and the power of the radio frequency power supply 210. As can be seen from FIG. 10, the voltage amplitude $V_{0p}$ at the output terminal of the matching box 220 was largely different from the voltage amplitude $V_{0p}$ of the second electrode 120.

When a radio frequency current supplied to the second electrode 120 was measured, the radio frequency current was 4 A at 50 W and was 5.7 A at 200 W, which were large values. It is considered that this is because an electric element is not connected between the matching box 220 and the second electrode 120, but a voltage drop occurs due to the inductance of a conductive line at a radio frequency of 40 MHz.

This result proved that it was preferable to use the measuring line 412, which was a dedicated line, in order to control the bias voltage with the potential of the second electrode 120.

Example 2

The radio frequency cut filter 320 is inserted in order to prevent radio frequency power generated by the radio frequency power supply 210 from flowing to the DC power supply 310 when a DC voltage is superimposed on the second electrode 120. In order to confirm this effect, an oscilloscope was connected to the rear end of the radio frequency cut filter 320 to measure the leakage of radio frequency power. As a result, the measured result was beyond the detection range.

Example 3

The same apparatus as that according to the fifth embodiment was used to check whether plasma potential can be reduced by superimposing a DC voltage on the second electrode 120.

As a raw material gas, 30 sccm of $SiH_4$ and 1700 sccm of hydrogen were used. The pressure of the deposition chamber 100 was 4 torr and the frequency and power of the radio frequency power supply 210 were 27 MHz and 300 W, respectively. An oscilloscope was used as the electrode potential measuring unit 410. The voltage of the second electrode 120 was measured while changing the output voltage $V_b$ of the DC power supply 310 from 0 V to −350 V. A polyimide film coated with a thin Ag film was used as the substrate 10. Since both ends of the substrate 10 come into contact with the deposition chamber 100, the substrate 10 was at the ground potential.

Figure 11:
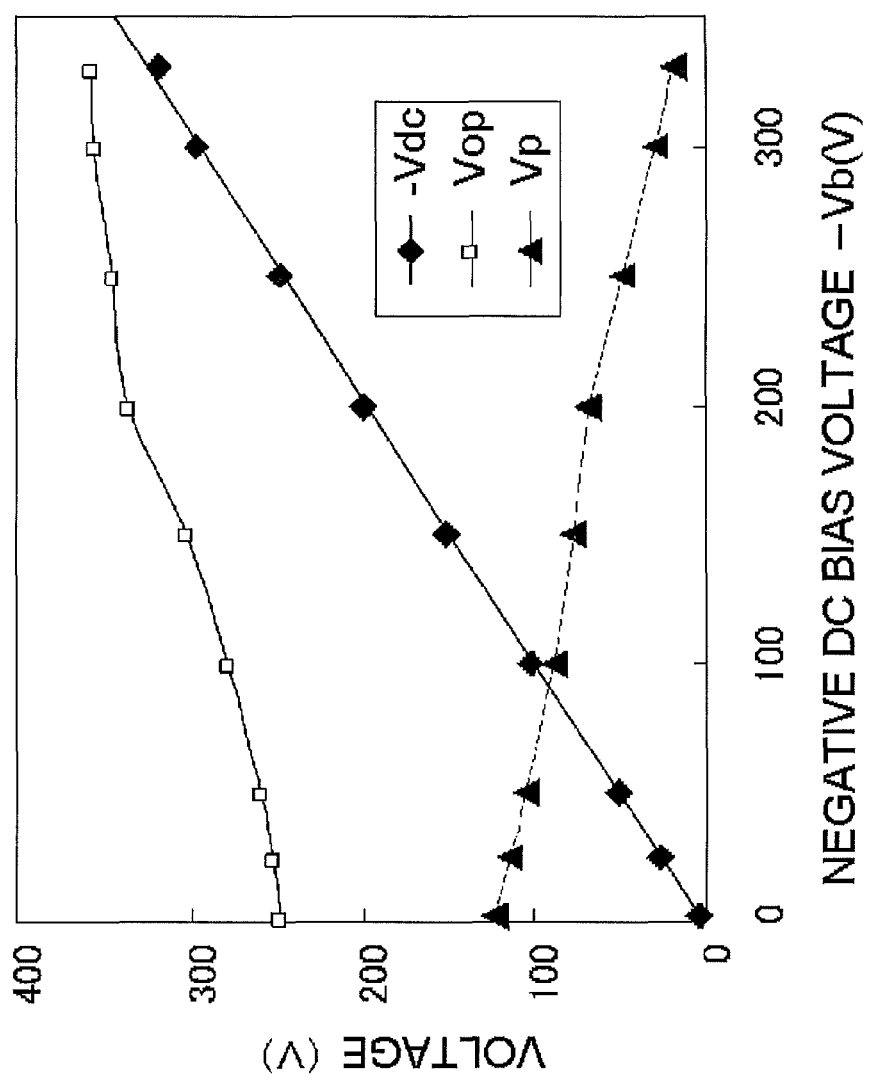
FIG. 11 is a graph illustrating the dependence of the average voltage $V_{dc}$ and the voltage amplitude $V_{0p}$ of the second electrode, and plasma potential $V_p$ on a negative DC bias voltage $-V_b$.

FIG. 11 is a graph illustrating the dependence of the average voltage $V_{dc}$ and the voltage amplitude $V_{0p}$ of the second electrode 120 on a negative DC bias voltage $-V_b$. FIG. 11 also shows the plasma potential $V_p$ calculated as $(V_{0p}+V_{dc})/2$.

$V_{dc}$ was equal to $V_b$. Therefore, the voltage generated by the DC power supply 310 was applied to the second electrode 120 without any change. In addition, when the DC bias voltage was not applied, a self-bias voltage $V_{dc}$ (floating potential) was −2 V, which was approximately zero. It is considered that potential is symmetric due to a symmetrical electrode structure or relative high pressure.

$V_{0p}$ increased with an increase in $-V_b$. However, the plasma potential $V_p$ was reduced as the bias voltage $V_b$ increased in the negative direction. On the contrary, when a positive DC bias was applied, the plasma potential $V_p$ increased. As such, it was possible to control the plasma potential $V_p$ by superimposing the DC bias voltage on the second electrode 120. It is estimated that the plasma potential $V_p$ is zero at a bias voltage $V_b$ of about −350 V. However, the potential of the second electrode 120 was changed and it was difficult to measure the potential. In practice, plasma varied over time and it was difficult to obtain stable discharge. It is considered that it is difficult to maintain radio-frequency discharge when the plasma potential $V_p$ is equal to or less than 0 V, which results in unstable discharge.

Figure 12:
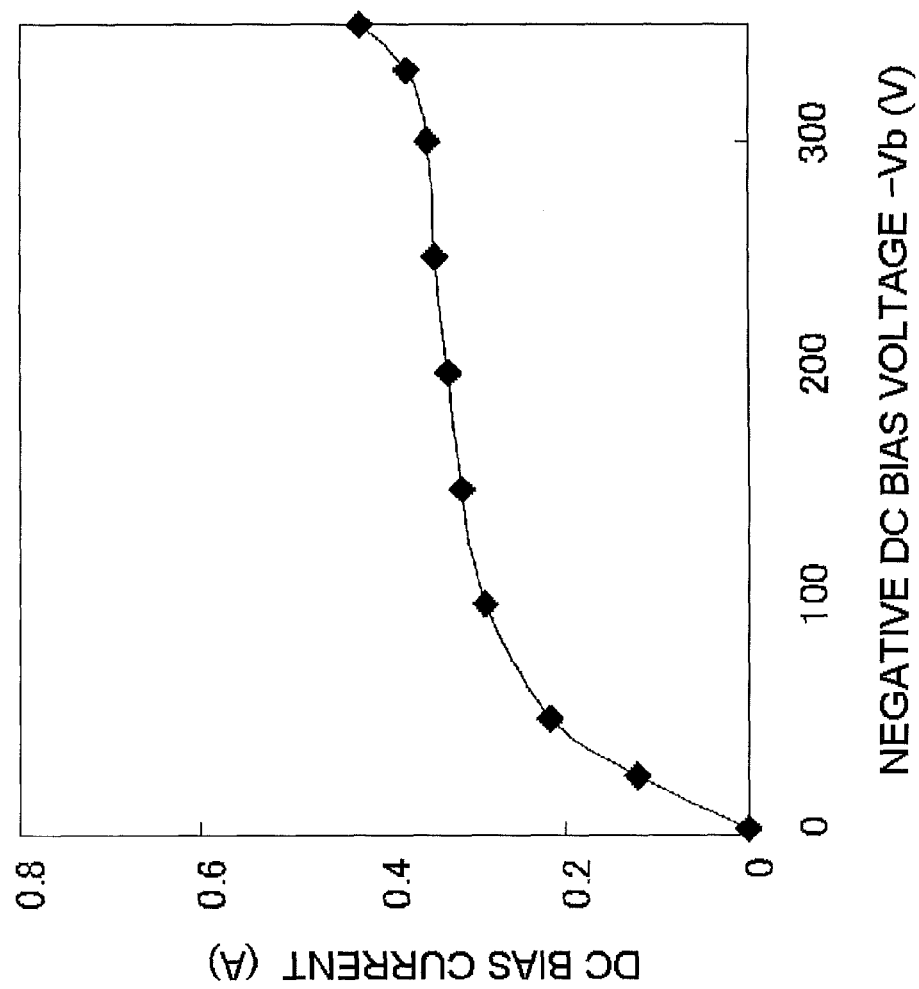
FIG. 12 is a graph illustrating the dependence of a DC current $I_b$ flowing by the application of a DC bias on the negative DC bias voltage $-V_b$.

FIG. 12 is a graph illustrating the dependence of a DC current $I_b$ flowing by the application of a DC bias on the negative DC bias voltage $-V_b$. The DC current $I_b$ tends to increase and be saturated with an increase in $-V_b$. However, when $-V_b$ is more than 300 V, the DC current $I_b$ increases sharply. In Example 3, the boundary was about 320 V, which was slightly less than the negative bias voltage $(-V_b=350 V)$ where the plasma potential $V_p$ was zero.

The thickness of the sheath of the second electrode 120 increased with an increase in $-V_b$. The sheath thickness when no bias voltage was input was about 1 mm. At a negative DC bias voltage $V_b$ of −200 V, plasma is shifted from the center between the electrodes toward the first electrode 110. Then, when $-V_b > 320 V$ was satisfied and the bias current increased sharply, plasma was distributed in the plane of the electrode so as not to be uniform in the plane direction of the electrode. A portion of the sheath of the second electrode 120 reached the first electrode 110 and plasma seemed to be dispersed in the surface of the first electrode 110. In this state, the average voltage $V_{dc}$ and the voltage amplitude $V_{0p}$ of the second electrode 120 were fluctuated and did not have stable values.

As described above, when the negative bias is applied to the second electrode 120, repulsive force acts on the electrons in the plasma and the plasma is away from the second electrode 120. At a point where the current increases rapidly, a portion of the sheath of the second electrode 120 reaches the first electrode 110 and DC discharge is believed to occur in this portion, which results in an increase in current. This is considered as a transition stage from a radio frequency discharge state to a DC discharge state. This result indicated that a stable radio frequency discharge was obtained in the range in which the bias current did not increase rapidly. In addition, when the film forming process was performed at the negative bias voltage ($-V_b=350$ V) where the plasma potential was zero, fine particles were deposited on the substrate 10. As a result, a film was not formed.

Example 4

In Example 3, glass that was not coated with a metal film was used as the substrate 10. Since glass had an insulating property, a DC bias current was less likely to flow. As a result, when a conductive substrate was used as the substrate 10, the bias current was 0.29 A at a negative DC bias voltage $V_b$ of −100 V. In contrast, when glass was used as the substrate 10, the bias current was reduced to 0.11 A under the same conditions. It is considered that this is because the current flows to a region of the first electrode 110 that is not covered with the substrate 10. Therefore, this example of the invention showed that it was preferable that a film-forming surface of the substrate 10 be electrically connected to the first electrode 110.

Example 5

A technique for reducing ion bombardment to improve the characteristics of a microcrystalline silicon thin film solar cell was verified. An n-type microcrystalline silicon layer (about 30 nm), an i-type microcrystalline silicon layer (about 2 μm), a p-type microcrystalline silicon layer (about 30 nm), a transparent electrode film made of ITO, and a comb-shaped electrode made of Ag were sequentially formed on a substrate 10, which was a polyimide film having an Ag film coated thereon as a rear electrode. Each of the microcrystalline silicon layers was formed by a plasma CVD method. A film forming apparatus was configured by connecting three film forming apparatuses shown in FIG. 9, and the microcrystalline silicon layers were deposited in the order of an n-layer, an i-layer, and a p-layer. A bias voltage was applied only when the i-type microcrystalline silicon layer was formed. When the i-type microcrystalline silicon layer was formed, $SiH_4$ and hydrogen gas were used as the raw material gas. When the n-type microcrystalline silicon layer and the p-type microcrystalline silicon layer were formed, gases obtained by respectively adding phosphine gas and diborane gas to $SiH_4$ and hydrogen gas were used as the raw material gas. The Ag film serving as the rear electrode and the ITO transparent electrode film were formed by a sputtering method, and the comb-shaped electrode was formed by a vapor deposition method.

Details of the deposition conditions of the i-type microcrystalline silicon layer, which is a photoelectric conversion layer, are as follows. As a film forming apparatus, the film forming apparatus according to the fifth embodiment was used. As a raw material gas, 20 sccm of $SiH_4$ and 1700 sccm of hydrogen were used. The pressure of the deposition chamber 100 was 4 torr and the temperature of the substrate 10 was 200° C. The frequency and power of the radio frequency power supply 210 were 27 MHz and 300 W, respectively. The DC bias voltage $V_b$ superimposed on the second electrode 120 was 'none' (floating potential: −3 V), −50 V, −100 V, −200 V, and −300 V. The substrate 10 come into contact with the first electrode 110 and both ends of the substrate 10 come into contact with the deposition chamber 100. Therefore, the substrate 10 was at the ground potential.

Figure 13:
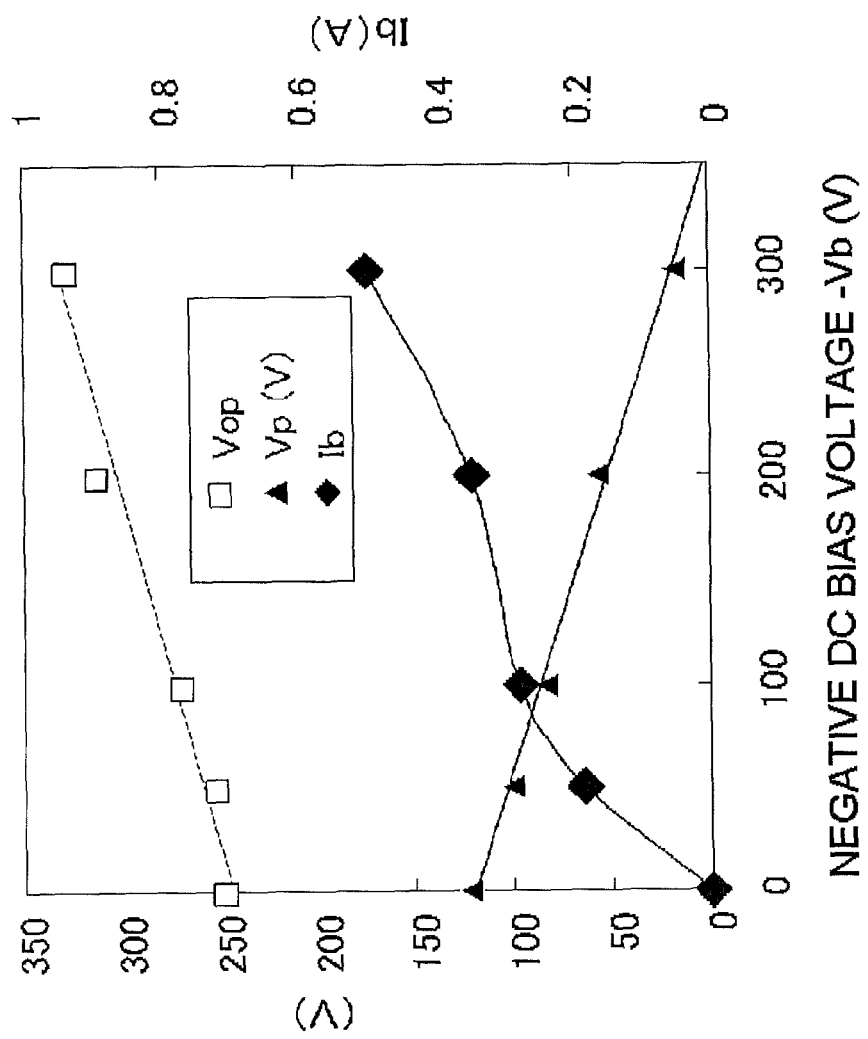
FIG. 13 is a graph illustrating the dependence of the voltage amplitude $V_{0p}$ of the second electrode, the plasma potential $V_p$, and the bias current $I_b$ on the negative DC bias voltage $-V_b$.

FIG. 13 shows the dependence of the radio frequency voltage amplitude $V_{0p}$ of the second electrode 120, the plasma potential $V_p$, and the bias current $I_b$ on the negative DC bias voltage $-V_b$. The dependence was the same as that in Example 3. In Example 5, it was estimated that the deposition condition was $V_p>0$ in all samples, and $V_p$ was 0 V at a DC bias voltage $V_b$ of −350 V.

As one of the film qualities of the microcrystalline silicon layer, the degree of crystallization of silicon was evaluated by Raman spectroscopy. As a parameter indicating the crystallization rate, the ratio $I_c/I_a$ of the height $I_c$ of the crystalline Si peak (510 cm$^{-1}$) to the height $I_a$ of the a-Si peak (480 cm$^{-1}$) was used.

The characteristics of the manufactured microcrystalline silicon thin film solar cell were measured by a solar simulator. In this case, photoelectric conversion efficiency was measured at a light intensity of 100 mW/cm$^2$.

The measurement result and the deposition rate are shown in Table 1.

TABLE 1

| Sample No. | SiH$_4$ (sccm) | $-V_b$ (V) | $V_p$ (V) | Deposition rate (nm/s) | $I_c/I_a$ | Conversion efficiency (%) |
| --- | --- | --- | --- | --- | --- | --- |
| 1 | 20 | 0 | 122 | 0.75 | 3.7 | 1.9 |
| 2 | 20 | 50 | 100 | 0.76 | 5.7 | 2.3 |
| 3 | 20 | 100 | 84 | 0.70 | 6.9 | 2.9 |
| 4 | 20 | 200 | 56 | 0.60 | 6.5 | 4.5 |
| 5 | 20 | 300 | 18 | 0.62 | 9.2 | 4.1 |

Figure 14:
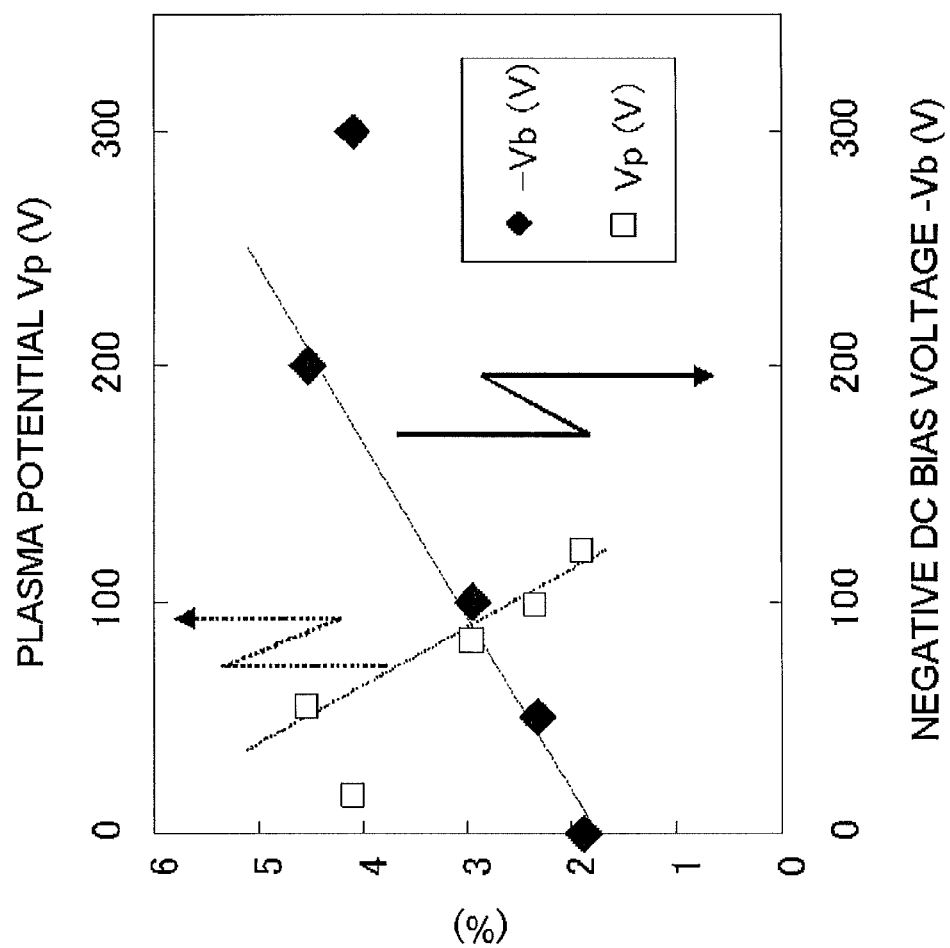
FIG. 14 is a graph illustrating the dependence of the photoelectric conversion efficiency of a solar cell on the negative DC bias voltage $-V_b$ and the dependence of the photoelectric conversion efficiency on the plasma potential $V_p$.

FIG. 14 shows the dependence of the photoelectric conversion efficiency on the negative DC bias voltage $-V_b$ and the dependence of the photoelectric conversion efficiency on the plasma potential $V_p$ when the flow rate of $SiH_4$ is 20 sccm. As the negative DC bias $-V_b$ increased, the photoelectric conversion efficiency increased. In addition, as the plasma potential was reduced, the photoelectric conversion efficiency was improved. As can be seen from FIG. 14, when the bias voltage $V_b$ is applied such that potential with respect to the first electrode 110 when the bias voltage $V_b$ is not applied is less than the potential (floating potential) of the second electrode 120, the photoelectric conversion efficiency is improved. In other words, for the plasma potential, when the bias voltage $V_b$ is applied so as to be less than the plasma potential with respect to the first electrode 110 when the bias voltage $V_b$ is not applied, the photoelectric conversion efficiency is improved. It is considered that this is because ion bombardment is reduced and film quality is improved.

However, when the DC bias voltage was reduced to −300 V, the photoelectric conversion efficiency was reduced. It is considered that this is because the plasma potential $V_p$ is approximately zero and a portion of the sheath of the second electrode 120 reaches the first electrode 110, which results in unstable plasma. A rapid increase in bias current supports the above.

This example showed that, when the DC bias voltage $V_b$ lower than the floating potential was applied to the second electrode 120, the characteristics of the microcrystalline silicon thin film solar cell were improved. In particular, when the plasma potential $V_p$ was equal to or less than 100 V, the photoelectric conversion efficiency was the maximum.

When the voltage of the second electrode 120 was reduced and the plasma potential was close to zero, the characteristics of the microcrystalline silicon thin film solar cell deteriorated. It is considered that this is because a portion of the sheath of the second electrode 120 reaches the first electrode 110 and plasma becomes unstable. At this time, the DC current flowing between the first electrode 110 and the second electrode 120 increases rapidly. Therefore, this example showed that it was preferable that the bias voltage when the film forming process was performed be equal to or less than a value where the plasma potential was greater than a specific value.

Figure 15:
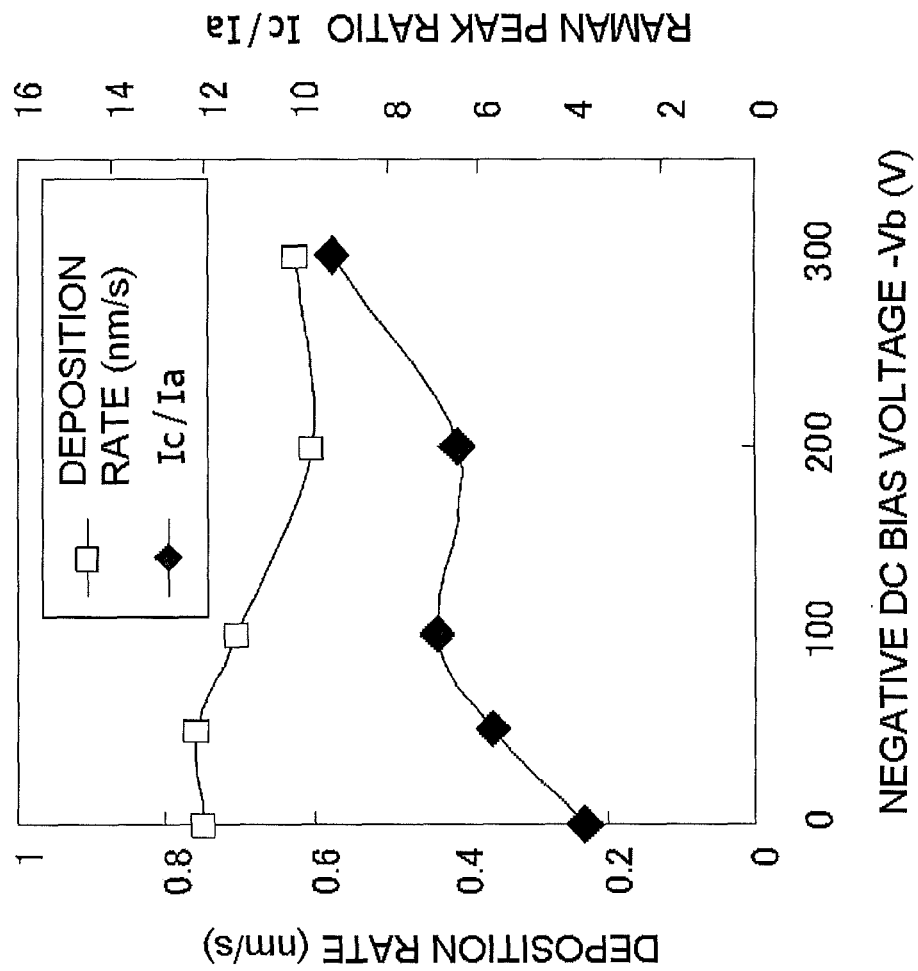
FIG. 15 is a graph illustrating the dependence of a deposition rate and a Raman peak height ratio $I_c/I_a$ on the negative DC bias voltage $-V_b$.

FIG. 15 shows the dependence of the deposition rate and the Raman peak height ratio $I_c/I_a$ on the negative DC bias voltage. The ratio $I_c/I_a$ tended to increase with an increase in the negative DC bias voltage. Since the microcrystalline silicon thin film solar cell has good characteristics in the vicinity of the boundary between amorphous silicon and crystalline silicon, it is preferable that the ratio $I_c/I_a$ be greater than 1 and be close to 1. Therefore, it is expected that the deposition rate and the characteristics of the solar cell will be improved by increasing the flow rate of $SiH_4$ to reduce the crystallization rate. This was confirmed in the following Example 6.

The deposition rate was reduced with a reduction in the DC bias. However, the amount of reduction was small and was about 15% at a negative DC bias voltage $V_b$ of −300 V. Therefore, as described above, it is expected that the deposition rate will be improved by increasing the flow rate of $SiH_4$. This was confirmed in the following Example 6.

Example 6

In the experiment according to Example 5, the microcrystalline silicon thin film solar cell was manufactured while changing the flow rate of $SiH_4$ in the deposition conditions of the i-type microcrystalline silicon layer. The manufactured samples were measured by the same method as that in Example 6. The measurement result and the deposition rate are shown in Table 2.

TABLE 2

| Sample No. | SiH$_4$ (sccm) | −V$_b$ (V) | V$_p$ (V) | Deposition rate (nm/s) | I$_c$/I$_a$ | Conversion efficiency (%) |
|---|---|---|---|---|---|---|
| 6 | 15 | 0 | 122 | 0.67 | 4.0 | 1.2 |
| 7 | 25 | 200 | 61 | 0.55 | 4.9 | 4.2 |
| 8 | 25 | 300 | 18 | 0.51 | 6.7 | 4.6 |
| 9 | 28 | 0 | 122 | 1.25 | 1.0 | 2.9 |
| 10 | 28 | 200 | 59 | 0.94 | 4.0 | 4.7 |

As the flow rate of $SiH_4$ increased, the deposition rate tended to increase and the ratio $I_c/I_a$ tended to decrease. As the flow rate of $SiH_4$ increased, the photoelectric conversion efficiency tended to increase. As can be seen from Table 2, the photoelectric conversion efficiency increases with an increase in the bias voltage $-V_b$ even when the ratio $I_c/I_a$ is considered.

Priority is claimed on Japanese Patent Application No. 2009-50453, filed Mar. 4, 2009, the content of which is incorporated herein by reference.

DRAWINGS

[FIG. 1]
320: RADIO FREQUENCY CUT FILTER
410: ELECTRODE POTENTIAL MEASURING UNIT
420: CONTROL UNIT (PLASMA POTENTIAL CALCULATING UNIT)
[FIG. 2]
POTENTIAL
FIRST ELECTRODE
POSITION
SECOND ELECTRODE
MAXIMUM POTENTIAL OF RADIO FREQUENCY
AVERAGE POTENTIAL OF RADIO FREQUENCY
MINIMUM POTENTIAL OF RADIO FREQUENCY
[FIG. 3]
POTENTIAL OF FIRST ELECTRODE (POTENTIAL OF SUBSTRATE)
PLASMA POTENTIAL
BIAS VOLTAGE
ION BOMBARDMENT ENERGY
[FIG. 4]
NEGATIVE
BIAS VOLTAGE
DC CURRENT BETWEEN FIRST ELECTRODE AND SECOND ELECTRODE
UNSTABLE REGION
STABLE REGION
[FIG. 5]
320: RADIO FREQUENCY CUT FILTER
410: ELECTRODE POTENTIAL MEASURING UNIT
420: CONTROL UNIT (PLASMA POTENTIAL CALCULATING UNIT)
[FIG. 6]
320: RADIO FREQUENCY CUT FILTER
410: ELECTRODE POTENTIAL MEASURING UNIT
414: ELECTRODE POTENTIAL MEASURING UNIT
420: CONTROL UNIT (PLASMA POTENTIAL CALCULATING UNIT)
[FIG. 7]
POTENTIAL OF SECOND ELECTRODE
POTENTIAL OF FIRST ELECTRODE (POTENTIAL OF SUBSTRATE)
PLASMA POTENTIAL
ION BOMBARDMENT ENERGY
BIAS VOLTAGE
[FIG. 8]
320: RADIO FREQUENCY CUT FILTER
410: ELECTRODE POTENTIAL MEASURING UNIT
414: ELECTRODE POTENTIAL MEASURING UNIT
420: CONTROL UNIT (PLASMA POTENTIAL CALCULATING UNIT)
[FIG. 9]
320: RADIO FREQUENCY CUT FILTER
410: ELECTRODE POTENTIAL MEASURING UNIT
420: CONTROL UNIT (PLASMA POTENTIAL CALCULATING UNIT)
[FIG. 10]
VOLTAGE AMPLITUDE
RADIO FREQUENCY POWER
OUTPUT TERMINAL OF MATCHING BOX
SECOND ELECTRODE
[FIG. 11]
VOLTAGE
NEGATIVE DC BIAS VOLTAGE

[FIG. 12]
DC BIAS CURRENT
NEGATIVE DC BIAS VOLTAGE
[FIG. 13]
VOLTAGE
NEGATIVE DC BIAS VOLTAGE
DC BIAS CURRENT
[FIG. 14]
PLASMA POTENTIAL
PHOTOELECTRIC CONVERSION EFFICIENCY
NEGATIVE DC BIAS VOLTAGE
[FIG. 15]
DEPOSITION RATE
DEPOSITION RATE
NEGATIVE DC BIAS VOLTAGE
RAMAN PEAK RATIO

The invention claimed is:

1. A method of forming a film, comprising the steps of:
   (a) providing a deposition chamber containing a first electrode and a second electrode facing the first electrode, a material gas therein, and a substrate on the first electrode;
   (b) grounding the first electrode;
   (c) supplying radio frequency power and a bias voltage to the second electrode, thereby to form a film from the material gas on the substrate by plasma CVD;
   (d) determining a first average potential of the second electrode with respect to the first electrode, with the radio frequency power supplied thereto without the bias voltage; and
   (e) during step (c), adjusting a second average potential of the second electrode with respect to the first electrode, to be less than the first average potential.

2. The method of forming a film according to claim 1, wherein the film formed on the substrate is a photoelectric conversion layer of a solar cell.

3. The method of forming a film according to claim 2, wherein the photoelectric conversion layer is a crystalline semiconductor or an amorphous semiconductor.

4. The method of forming a film according to claim 1, wherein the bias voltage is a DC voltage or is an AC voltage whose average voltage value is not zero.

5. The method of forming a film according to claim 1, further comprising the steps of:
   determining a first plasma potential, which is a potential of plasma in the deposition chamber with respect to the first electrode with the radio frequency power supplied to the second electrode without the bias voltage; and
   controlling the bias voltage such that a second plasma potential, which is a potential of the plasma in the deposition chamber with respect to the first electrode, is less than the first plasma potential, and is more than zero.

6. The method of forming a film according to claim 5, wherein the second plasma potential is determined based upon $(V_{dc}+V_{0p})/2$, where the second average potential is $V_{dc}$, and voltage amplitude of the second electrode with respect to the first electrode is $V_{0p}$.

7. The method of forming a film according to claim 6, wherein during step (c), the bias voltage is controlled such that the second plasma potential is less than 100 V.

8. The method of forming a film according to claim 6, further comprising the steps of:
   providing a power lead wire for transmitting the radio frequency power;
   providing a measuring line that is connected to the second electrode but is separated from the power lead wire; and
   using a signal of the measuring line to determine the second average potential $V_{dc}$ and the voltage amplitude $V_{0p}$.

9. The method of forming a film according to claim 1, further comprising the step of supplying the bias voltage to the second electrode through a radio frequency cut filter that removes a high frequency component from the supplied radio frequency power.

10. The method of forming a film according to claim 1, further including the steps of:
    determining a specific value, such that if a plasma potential, which is a potential of plasma in the deposition chamber with respect to the first electrode, is lower than the specific value and if the bias voltage is controlled such that the plasma potential is close to zero, a DC current flowing between the first electrode and the second electrode increases rapidly; and
    during step (c), controlling the bias potential such that the plasma potential is greater than the specific value.

11. The method of forming a film according to claim 1, wherein the material gas includes at least one gas selected from the group consisting of a silicon-containing gas, a carbon-containing gas, and a germanium-containing gas.

12. The method of forming a film according to claim 11, wherein the material gas includes an impurity gas and a diluent gas including at least one of hydrogen and rare gases.

13. The method of forming a film according to claim 1, wherein the film is a semiconductor film.

14. The method of forming a film according to claim 13, wherein the semiconductor film includes silicon, germanium, or carbon.

15. The method of forming a film according to claim 1, wherein the substrate is flexible.

16. The method of forming a film according to claim 15, further comprising the step of forming the film by continuously depositing the film on the substrate.

17. The method of forming a film according to claim 15, wherein the substrate is made of at least one material selected from the group consisting of polyimide, polyamide, polyimide amide, polyethylene naphthalate, polyethylene terephthalate, polyether imide, polyether ether ketone, and polyether sulfone.

18. The method of forming a film according to claim 15, wherein the substrate is a metal film.

19. The method of forming a film according to claim 1, wherein the substrate includes an insulator base and a conductive film formed on a surface of the insulator base.

20. The method of forming a film according to claim 1, wherein a film formed on the substrate surface is electrically connected to the first electrode.

21. The method of forming a film according to claim 1, wherein the substrate is made of glass or metal.

22. The method of forming a film according to claim 1, wherein a frequency of the radio frequency power is equal to or more than 13 MHz.

23. A method of forming a film, comprising:
    (a) providing a deposition chamber containing a first electrode, a second electrode facing the first electrode, a material gas therein and a substrate on the first electrode;
    (b) supplying radio frequency power to the second electrode so as to generate a plasma;
    (c) during step (b), supplying a bias voltage to the first electrode or the second electrode; and
    (d) during steps (b) and (c), controlling the bias voltage on the basis of a first plasma potential, the first plasma potential being a potential of the plasma with respect to the first electrode, determined based upon $(V_{dc}+V_{0p})/2$, to form the film on the substrate from the material gas by plasma CVD, $V_{dc}$ being an average potential of the second electrode with respect to the first electrode and $V_{0p}$ being a voltage amplitude of the second electrode with respect to the first electrode.

24. The method of forming a film according to claim 23, determining a second plasma potential, which is a potential of the plasma with respect to the first electrode, with the radio frequency power supplied to the second electrode without the bias voltage applied thereto, wherein during step (d) the bias voltage is controlled such that the first plasma potential is less than the second plasma potential.

25. The method of forming a film according to claim 24, wherein during step (d) the bias voltage is controlled such that the first plasma potential is more than zero.

26. The method of forming a film according to claim 23, wherein during step (d) the bias voltage is controlled such that the first plasma potential is less than 100 V.

27. The method of forming a film according to claim 23, further comprising the step of forming a film on the substrate that is a photoelectric conversion layer of a solar cell.

28. The method of forming a film according to claim 27, wherein the photoelectric conversion layer is a crystalline semiconductor or an amorphous semiconductor.

29. The method of forming a film according to claim 23, wherein the bias voltage is a DC voltage or is an AC voltage having an average voltage value that is not zero.

30. The method of forming a film according to claim 23, wherein the bias voltage is an AC voltage having an average voltage value that is not zero and having a frequency lower than the frequency of the radio frequency power.

31. The method of forming a film according to claim 23, wherein the bias voltage is supplied to the second electrode, and the first electrode is grounded.

32. The method of forming a film according to claim 31, further comprising the step of removing a high frequency component supplied from the radio frequency power with a radio frequency cut filter provided on a bias voltage supply line that supplies the bias voltage to the second electrode.

33. The method of forming a film according to claim 31, further comprising the steps of:
providing a power lead wire for transmitting the radio frequency power;
providing a measuring line that is connected to the second electrode and is separated from the power lead wire; and
using a signal of the measuring line to determine the average potential $V_{dc}$ and the voltage amplitude $V_{0p}$.

34. The method of forming a film according to claim 23, wherein the bias voltage is supplied to the first electrode, and the first electrode is not grounded.

35. The method of forming a film according to claim 23, further comprising the step of determining a specific value, such that if the first plasma potential is lower than the specific value and if the bias voltage is controlled such that the first plasma potential is close to zero, a DC current flowing between the first electrode and the second electrode increases rapidly, wherein during step (d) the bias potential is controlled such that the first plasma potential is greater than the specific value.

36. The method of forming a film according to claim 23, wherein the material gas includes at least one gas selected from the group consisting of a silicon-containing gas, a carbon-containing gas, and a germanium-containing gas.

37. The method of forming a film according to claim 36, wherein the material gas includes an impurity gas and a diluent gas including at least one of hydrogen and rare gases.

38. The method of forming a film according to claim 23, wherein the film is a semiconductor film.

39. The method of forming a film according to claim 38, wherein the semiconductor film includes silicon, germanium, or carbon.

40. The method of forming a film according to claim 23, wherein the substrate is flexible.

41. The method of forming a film according to claim 40, further comprising the step of the continuously depositing the film on the substrate.

42. The method of forming a film according to claim 40, wherein the substrate is made of at least one material selected from the group consisting of polyimide, polyamide, polyimide amide, polyethylene naphthalate, polyethylene terephthalate, polyether imide, polyether ether ketone, and polyether sulfone.

43. The method of forming a film according to claim 40, wherein the substrate is a metal film.

44. The method of forming a film according to claim 23, wherein the substrate includes an insulator base and a conductive film formed on a surface of the insulator base.

45. The method of forming a film according to claim 23, wherein a film formed on the substrate surface is electrically connected to the first electrode.

46. The method of forming a film according to claim 23, wherein the substrate is made of glass or metal.

47. The method of forming a film according to claim 23, wherein a frequency of the radio frequency power is equal to or more than 13 MHz.

* * * * *